United States Patent [19]
Bell et al.

[11] Patent Number: 5,668,699
[45] Date of Patent: Sep. 16, 1997

[54] SYSTEM AND METHOD FOR PROVIDING UNIFORM SOLDER JIUNT HEIGHT FOR PRINTED CIRCUIT BOARDS AND THEIR ASSEMBLIES

[75] Inventors: James S. Bell, Cedar Park; Gita Khadem; Joseph A. Vivio, both of Austin, all of Tex.

[73] Assignee: Dell USA L.P., Round Rock, Tex.

[21] Appl. No.: 683,161

[22] Filed: Jul. 18, 1996

Related U.S. Application Data

[63] Continuation of Ser. No. 270,848, Jul. 5, 1994, abandoned.
[51] Int. Cl.⁶ .................... H05K 5/04; H05K 9/00
[52] U.S. Cl. .................... 361/753; 174/51; 228/215; 361/752; 361/818
[58] Field of Search .................... 174/250, 255, 174/260, 261, 264, 265, 266, 51, 35 R; 228/179.1, 180.1, 215; 361/752, 753, 796, 799, 800, 801, 759, 816, 818; 427/96–98; 439/68, 83, 84, 108, 109; 455/90, 300, 347, 348

[56] References Cited

U.S. PATENT DOCUMENTS

| | | |
|---|---|---|
| 4,851,614 | 7/1989 | Duncan, Jr. .................... 174/263 |
| 5,138,529 | 8/1992 | Colton et al. .................... 361/818 |
| 5,326,937 | 7/1994 | Watanabe .................... 174/263 |
| 5,398,156 | 3/1995 | Steffes et al. .................... 361/453 |
| 5,420,378 | 5/1995 | Estes et al. .................... 174/263 |

*Primary Examiner*—Donald Sparks
*Attorney, Agent, or Firm*—Diana L. Roberts; Henry N. Garrana; Mark P. Kahler

[57] ABSTRACT

There is disclosed a technique for constructing a printed circuit board assembly to provide solder joints with a uniform height. A solder mask is provided on the external surfaces of the printed circuit board to minimize the mount of conductive pad area that is exposed to solder. The solder mask includes a plurality of relatively small openings with a predetermined pattern to minimize the build up of solder, while insuring sufficient solder height to connect to the grounding component located on the chassis to insure adequate EMI protection. Preferably a polka dot pattern is used for certain conductive pads, while a single narrow strip or the solder mask opening configuration is used for rectangular pad configurations. Other configurations and patterns are also available to provide an adequate electrical connection while insuring uniform solder height.

19 Claims, 7 Drawing Sheets

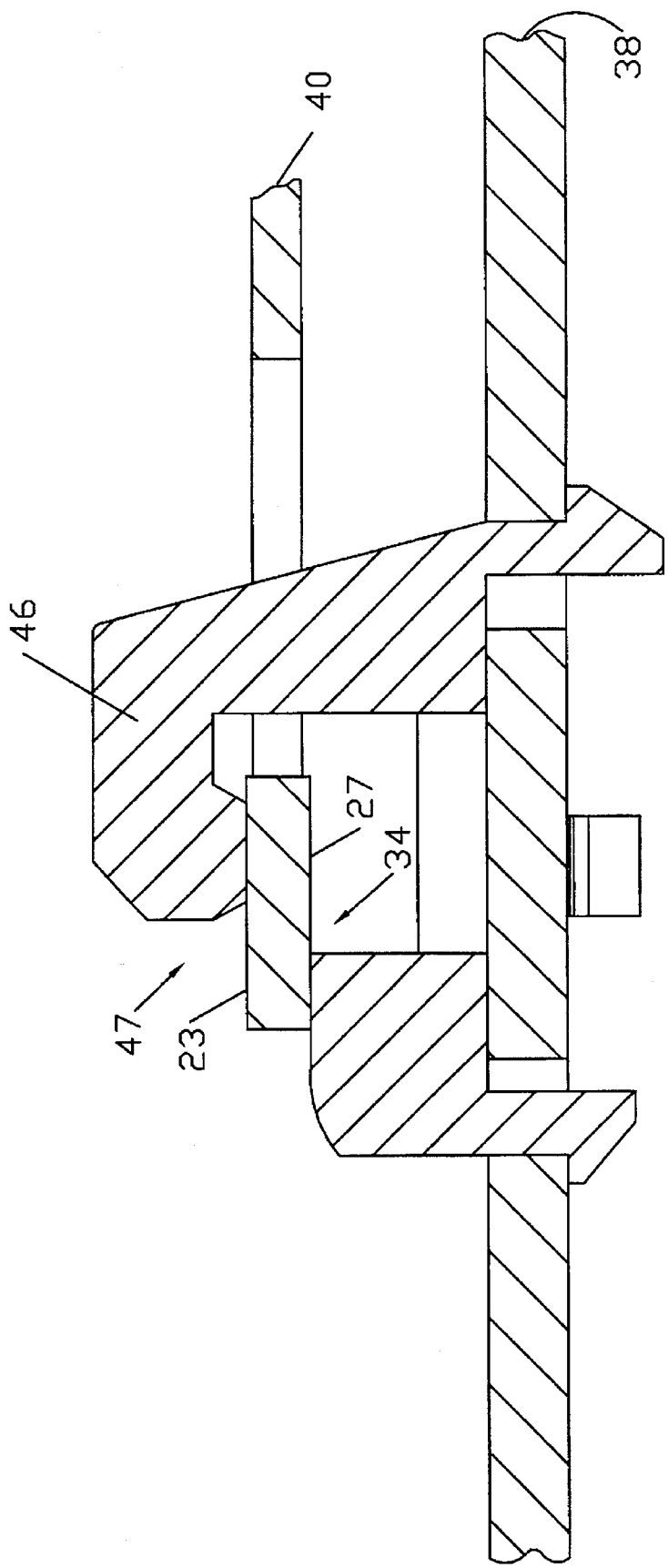

SYSTEM AND METHOD FOR PROVIDING UNIFORM SOLDER JIUNT HEIGHT FOR PRINTED CIRCUIT BOARDS AND THEIR ASSEMBLIES

This is a continuation of application Ser. No. 08/270,848 filed on Jul. 5, 1994, now abandoned.

FIELD OF THE INVENTION

The present invention relates generally to computers and other electronic assemblies comprising printed circuit boards, and more particularly, to apparatus and methodologies for affixing printed circuit boards within a computer or other electronic assemblies. More particularly, the invention relates to the design and configuration of printed circuit boards capable of supporting a variety of electrical components. Still more particularly, the present invention relates to solder mask patterns for uniformly controlling the size and height of solder joints on printed circuit board assemblies to facilitate installation of the circuit board and to insure proper grounding and circuit connections on the circuit board once installed.

BACKGROUND OF THE INVENTION

Computer and other electronic assemblies typically include a plurality of printed circuit (PC) boards that support electronic components. Commonly, PC boards are secured within a steel or plastic chassis for an electronic assembly by means of screws extending through holes in the PC board and threadedly engaged to a portion of the chassis. In addition to the mounting screws, the assignee of the present invention also has used an alternative PC board mounting technique by which vertically-extending plastic hooks are molded into the base of the computer chassis. The hooks are received through slots formed in a PC board as the PC board, lying in a horizontal plane, is lowered onto the base of the chassis. After the PC board is seated on the chassis, with hooks extending through slots, the PC board is displaced horizontally to engage the hooks on the upper surface of the PC board at one end of the slots, thereby preventing vertical motion of the PC board. Thereafter, a small plastic catch mechanism is snapped into engagement with an edge of the PC board to prevent further horizontal motion.

Because of the sensitivity of electrical components, and the risk that electrical circuits may be shorted if not properly secured within the product, it is necessary to ground the circuit board and to provide a ground for the electrical components on the circuit board. In many instances, both of these functions are provided by the fasteners (screws and/or hooks) that extend through the circuit board to the chassis of the product. Thus, for example, in a personal computer chassis, the motherboard containing many of the computer's electrical components is fastened to the chassis by a plurality of mounting screws and/or hooks. Because the chassis usually is constructed of a conductive material, or contains a conductive layer, a path to ground is provided through the mounting fasteners. The grounding of the circuit board is necessary to provide shielding against electromagnetic interference ("EMI") from outside sources, which might otherwise disturb the operation of the components on the circuit board.

As one skilled in the art will understand, a large variety of electrical components may be mounted on the circuit board, including integrated circuits and other discrete components. Typically, the electrical components are mounted on the circuit board in one of two ways. The first technique for mounting electrical components on a circuit board is to provide electrical leads on the electrical components that extend through the circuit board. The tips of these leads then are bent and/or soldered to an outer surface of the circuit board. Where space is limited, solder usually is preferred as a method to both secure the electrical component to the circuit board, and to provide a high quality electrical connection between the leads and the circuit paths on or in the circuit board. In order to perform this soldering process, usually a wave soldering machine is used to provide the requisite soldering of connections on one or both sides of the circuit board. Typically, the circuit board is placed in the wave soldering machine so that solder is applied to all conductive surfaces on the bottom of the circuit board.

In addition to providing solder to the leads of the electrical components, solder also is applied to conductive pad surfaces on the solder-side of the circuit board during the wave soldering process. To the extent that conductive surfaces on the solder-side of the board are not to be soldered, a solder mask must be provided as the bottom layer of the circuit board. The solder mask resists the application of solder. Thus, in accordance with normal techniques, the solder-side surface of the circuit board is designed with conductive pads, such as copper, where solder is to be deposited during the wave soldering process. Some of the larger conductive pads that are provided on the bottom of the circuit boards are the grounding pads, where grounding screws and/or hooks are to be attached or mounted.

Printed circuit boards typically are designed in layers, with various circuit paths, and in some instances, circuit elements, in each layer of the board. Thus, a typical circuit board has a number of different layers, with the upper and lower layers including circuit paths for connecting to components that are mounted to the top or bottom of the circuit board. In prior art circuit boards, typically a plurality of "plated through holes" are provided for receiving the grounding screws. As that term is conventionally used, plated through holes are holes drilled through the circuit board, which include a conductive material applied to the board at the periphery of the mounting hole so that each layer of the circuit board can be electrically connected to the grounding screw. In addition, a solid conductive (copper) pad typically is provided on external layers of the board adjacent the aperture for the screw. The upper pad functions to connect to the head of the screw, while the lower pad functions to connect to the body or chassis of the product in which the board is mounted. Solder tends to wick through the plated through holes, and to accumulate in large mounts on the relatively large pads. Because solder is not applied evenly in the wave solder process (based upon various considerations such as surface tension, etc.), after soldering the solder deposited on the conductive pads and plated through holes tends to be uneven, and in fact, relatively large bumps or clusters may appear at one portion of the pad while other portions have relatively large valleys. This problem is greatly exaggerated on larger pad areas, such as the grounding pads.

Because of these abnormalities in solder heights at the grounding pads and plated through holes, the installation of the boards may prove difficult, if not impossible. For example, in assignee's personal computers, hooks are used to secure the motherboard to the chassis. The hook therefore functions as a clamp by sandwiching the motherboard in place. See U.S. application Ser. No. 08/179,806, filed Jan. 11, 1994, the teachings of which are incorporated by reference as if fully set forth herein. The hook has a certain clearance to accommodate the circuit board. If the conductive pads at the site of the hook are too high, the circuit board will not fit within the hook structure. If, conversely, the height of the solder is too low, the conductive pad will not make a good contact with the hook and/or the metal chassis of the product in which the board is mounted, causing potential problems with electromagnetic interference. Moreover, if the height of the solder varies from one pad to another, the board will not lie flat within the chassis, but instead will be required to flex and bulge to fit properly in the chassis, causing stress on the circuit board. To alleviate these problems it typically is necessary to manually touch-up the larger solder pads in order to remove excess solder, or to add solder to provide a uniform solder height. This manual rework of the PC board adds significantly to the cost of manufacturing the circuit boards. Consequently, it would be advantageous to develop a technique for uniformly depositing solder on a circuit board during a wave soldering process to provide a solder joint with sufficient quantities of solder to provide adequate EMI protection, without providing too much solder to create problems with installation.

A second common technique for attaching electrical components to circuit boards is to surface mount the components by placing the component on conductive solder pads on the surface of the board. The solder then is heated in an appropriate chamber to reflow the solder on each pad to obtain a soldered connection with an associated lead or pad on the component. During the assembly of the circuit board, solder paste typically is deposited on the board by an automated (solder paste screening) machine, so that the solder paste is deposited in a relatively uniform manner to all of the conductive surfaces on the board. In addition to providing conductive paths for connecting to the leads of the surface mount components, it is common to also deposit solder paste on larger conductive pads where grounding is necessary, for example, where grounding screws and other attachments are to be located.

In the situation where the conductive pads are relatively large, the solder paste deposited on these pads tends to flow unevenly over the entire pad boundary when the reflow process occurs, leaving minimal or no solder height to electrically connect to the components provided on the chassis for grounding. There is a need to control and maintain the flow of the solder during the reflow process, to achieve enough solder raised above the surface in a desired area to provide a high quality electrical connection.

In many applications, such as computer motherboards, both types of components (surface mounts and through-hole) are used on the same circuit board. Typically, the surface mount components are soldered first on one side of the board, and then the board is placed in a wave solder machine to wave solder the other side of the board to connect the through hole devices to circuitry on the circuit board. In this situation, the problems with surface mount soldering and wave soldering are both present.

It obviously would be advantageous to develop a method for constructing a circuit board which would provide a uniform solder height for the larger solder areas to facilitate ease of installation and to insure adequate grounding for EMI protection regardless of the type of soldering that is used or the type of circuit board that is implemented.

SUMMARY OF THE INVENTION

Accordingly, there is provided herein a system and process of providing uniform solder joint heights by limiting the amount of solder that is deposited, while still insuring the adequacy of the ground connection. Typically, large conductive pad areas are provided adjacent the apertures for the grounding screws and/or hooks. In the preferred embodiment, an upper and lower solder mask pattern is used to limit the amount of pad area that is exposed to the solder.

In the preferred embodiment, a bottom solder mask layer of a particular configuration is used to distribute the solder in dimples on the conductive ground pad areas on the bottom of the PC board so that the amount of solder deposited during wave soldering is limited by controlling the amount of copper that is exposed on the surface of the circuit board.

Similarly, on the top of the PC board, the conductive pad area adjacent the grounding hook aperture is covered by a top solder mask layer to limit the portion of the pad that is exposed. Other ground pad surfaces that tend to overflow during reflow of the solder paste on the surface mount side of the board may include patterns in the top solder mask layer with a particular configuration accompanied with an identical solder past configuration to minimize the problem with solder flowing or spreading over the entire area of the pad leaving no height for proper electrical contact during the reflow process.

In one embodiment of the present invention, a plurality of polka dot shaped holes are designed in the portion of solder mask layers overlaying the ground pads so that relatively small dots or dimples of solder are deposited uniformly in the pad area on both sides of the PC board. The polka dots may be arranged uniformly in rows and columns, or can be offset. Alternatively, and especially for the pad surfaces on the surface mount side of the PC board adjacent the hook aperture, the solder mask preferably is designed with a strip opening for permitting a single, relatively narrow conductive strip for mating with the conductive grounding hook or other features provided on the chassis for grounding.

As part of the present invention, plating is eliminated from the apertures for the screws and certain other components to prevent the excess accumulation of solder which typically results. Instead, the present invention uses a plurality of relatively small plated via holes. The via holes preferably are spaced radially around the aperture on the conductive external pads and include a plated through connection to connect to inner layers of the board.

These and other characteristics and advantages of the present invention will become readily apparent to those skilled in the art upon reading the following detailed description and claims and by referring to the accompanying drawings.

BRIEF DESCRIPTION OF THE DRAWINGS

For a more detailed description of the preferred embodiment of the invention, reference will now be made to the accompanying drawings, wherein:

FIG. 7 is a side elevation of FIG. 6, partly in cross-section, taken along line 7—7;

DESCRIPTION OF THE PREFERRED EMBODIMENT

The principles of the present invention are generally applicable to any type of printed circuit board, regardless of the intended use of that circuit board. In the preferred embodiment and in the following discussion, however, the focus will be on a motherboard for a personal computer. One skilled in the art will understand, however, that the present invention is not limited to use on computer-related circuit boards, but instead can be readily implemented on any circuit board to provide uniform solder joint heights. Similarly, the principles of the present invention are generally applicable to any type of circuit board that requires solder joints, including HASL (hot air solder level) boards, ENTEK® coated circuit boards, bare copper printed wire boards (PWB's), and the like. Consequently, the terms "circuit board," "printed circuit board" and "PC board" are used generically in this description to refer to the various alternative circuit board designs requiring soldered connections.

Figure 1:
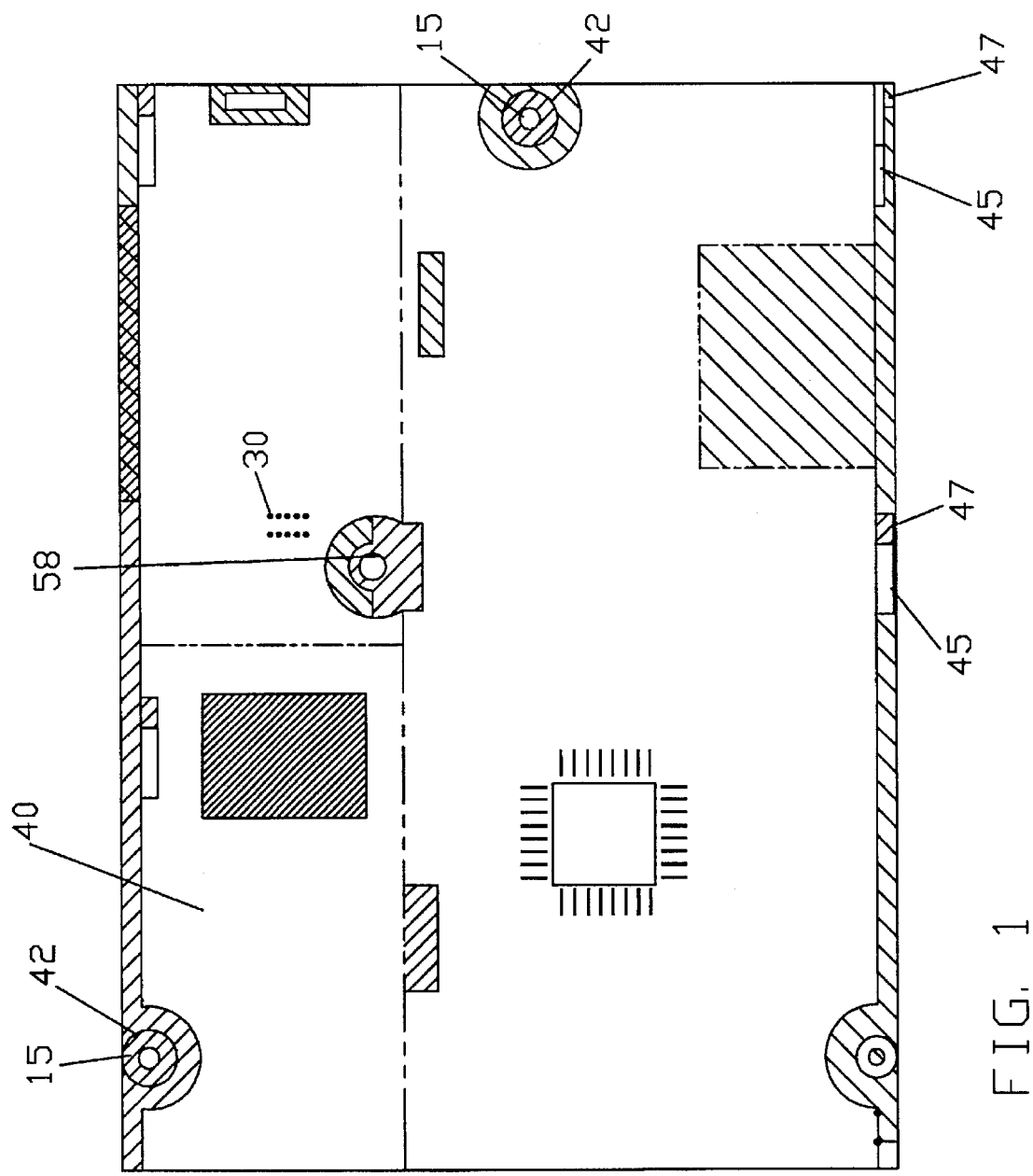
FIG. 1 is a top view of a printed circuit board constructed in accordance with the preferred embodiment of the present invention.
Figure 2:
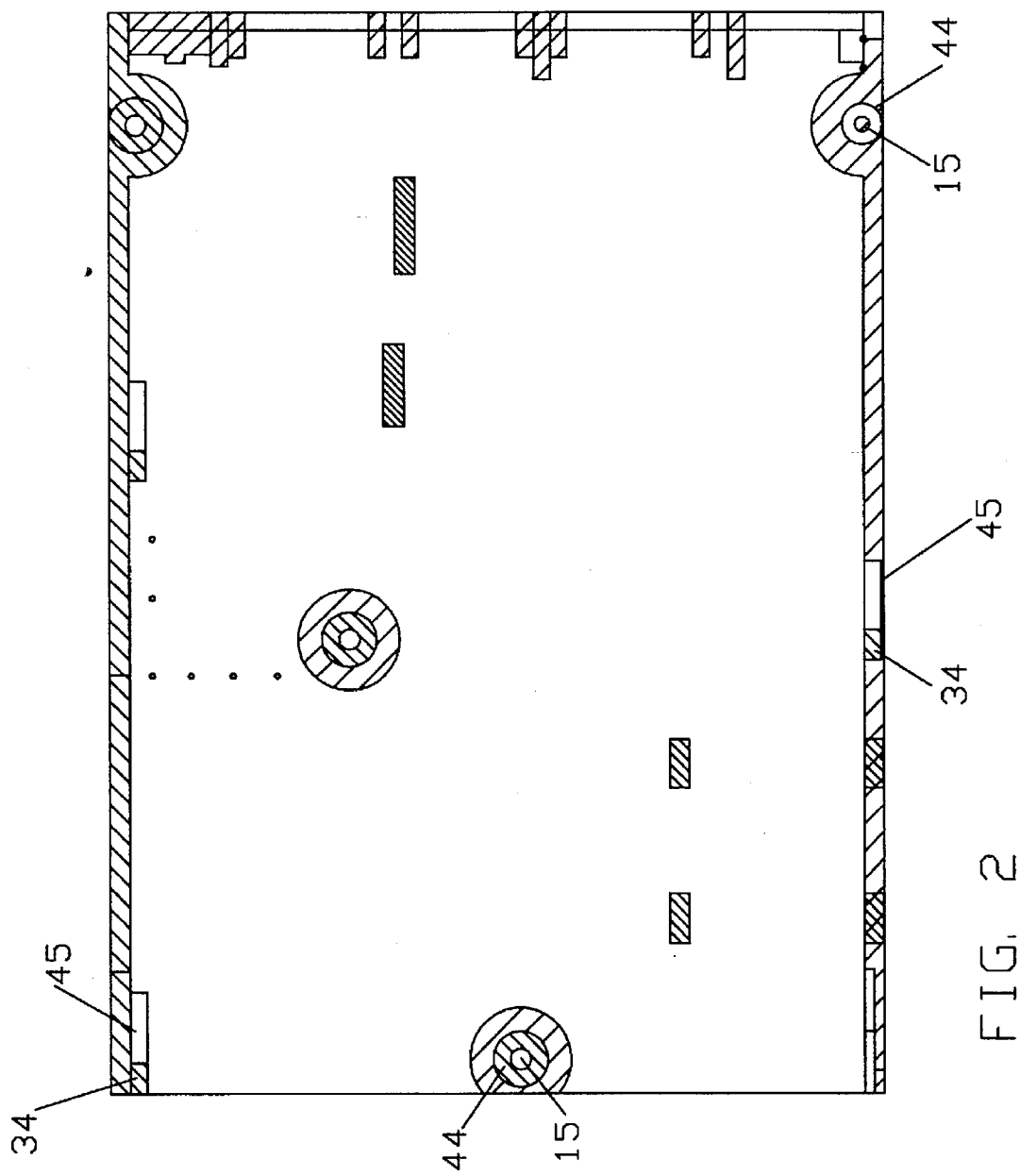
FIG. 2 is a bottom view of a printed circuit board constructed in accordance with the preferred embodiment.
Figure 6:
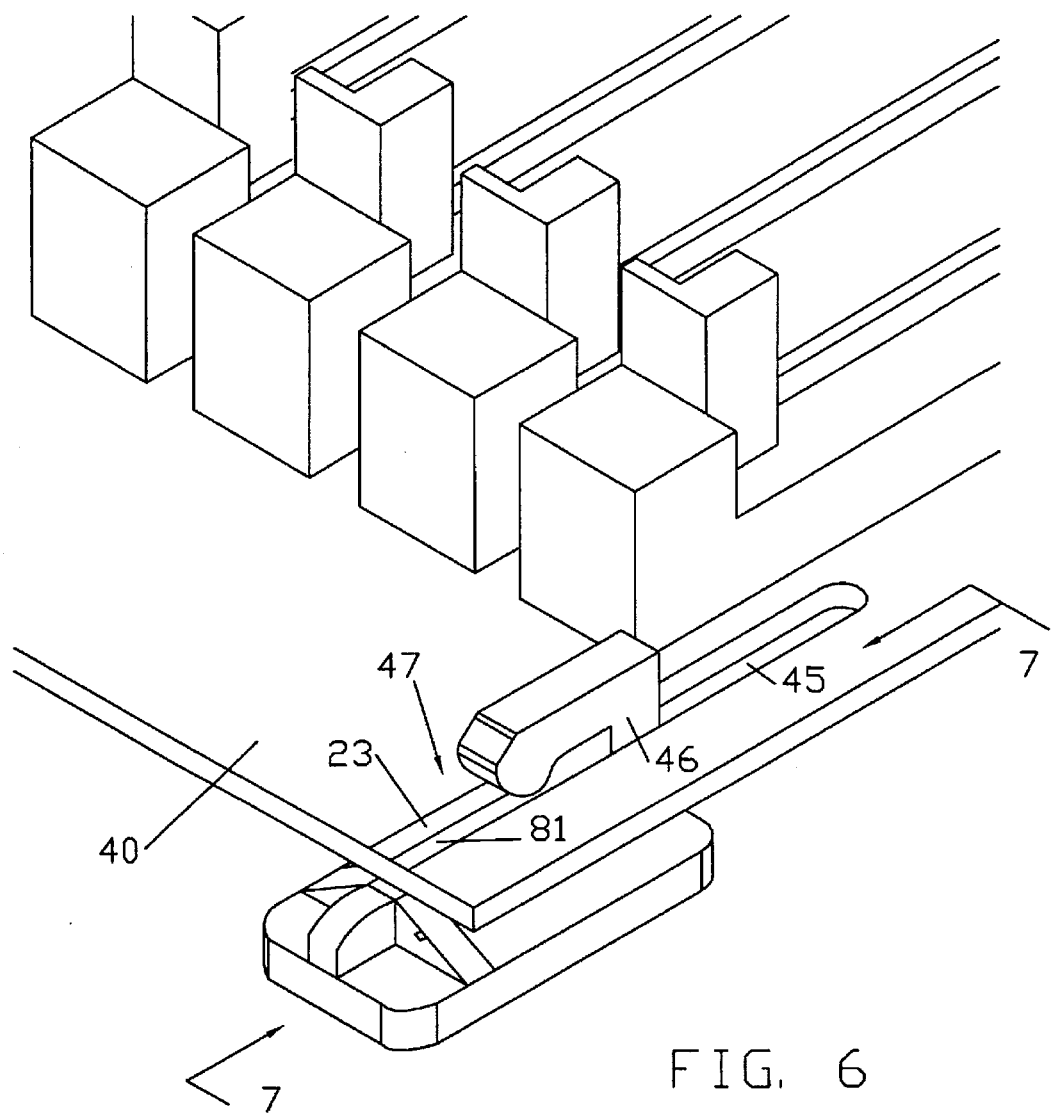
FIG. 6 is a perspective view demonstrating the installation of a circuit board with a mounting hook.
Figure 8:
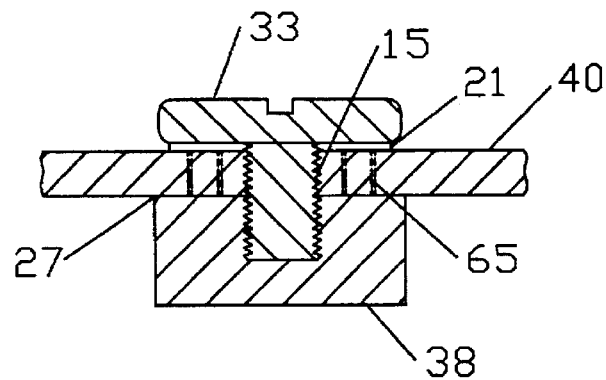
FIG. 8 is a side elevation, partly in cross-section, demonstrating the installation of a circuit board with a mounting screw.

Referring now to FIG. 1, the top side of a typical printed circuit board 40 constructed generally in accordance with the preferred embodiment is shown. The circuit board 40 generally includes a plurality of pads 25 for receiving surface mounted components (not shown), and a plurality of plated-through holes 30 for receiving the leads of through hole components. Only a few such pads 25 and holes 30 have been shown for the sake of simplicity. In addition, a plurality of generally circular apertures 15 are provided in the board for receiving mounting screws, and a plurality of generally elongated apertures 45 are provided for receiving mounting hooks. As shown in FIGS. 6, 7 and 8, mounting hooks 46 and grounding screws 33 are used in the preferred embodiment to secure the printed circuit board 40 to the body or chassis 38 of the product in which the board is installed. Preferably, both the screws 33 and hooks 46 include, or are constructed of, a conductive material to provide a conductive path to ground for the circuit board. In accordance with the preferred embodiment, and referring still to the top side of the board as shown in FIG. 1, the circuit board 40 includes a conductive pad surface 42 adjacent the screw apertures 15 and another conductive pad surface 47 adjacent the hook apertures 45, to provide a surface for connecting to the screw or hook, and to function as a ground path from the circuit board to the grounding screw or hook. Similarly, as shown in FIG. 1, other conductive ground pads 58 also may be provided as necessary to complete the design of the circuit board. Referring now to FIG. 2, the bottom side of the PC board similarly includes a conductive pad surface 44 adjacent the screw apertures 15 and a generally rectangular pad surface 34 adjacent the hook apertures 45. In the preferred embodiment, solder is deposited on conductive surfaces on the top side of the board by a solder paste screening machine and then reflowed in an oven, while solder is applied subsequently to the bottom side of the PC board in a wave solder machine.

Figure 5:
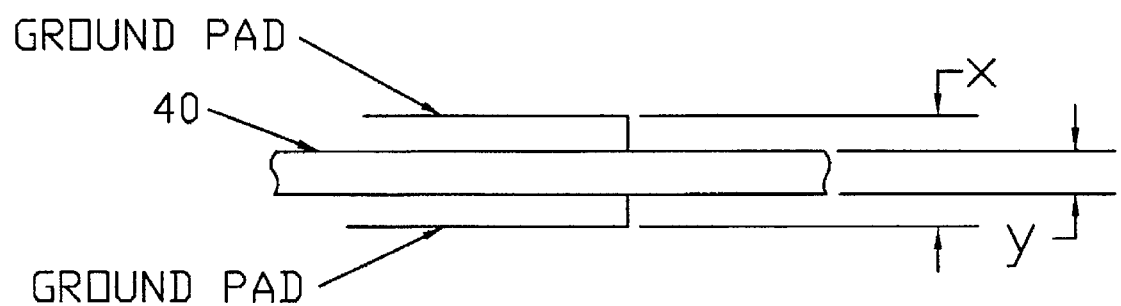
FIG. 5 is a side elevation of the printed circuit board after soldering to illustrate clearance tolerances.

Because the present invention preferably is designed for use with grounding hooks 46 (see FIGS. 6 and 7), the circuit board 40 is configured with a specified thickness to fit within the dimensions of the grounding hook. Even if a hook is not used, the board must be configured with a thickness that is less than the length of the grounding screw, and which is sufficiently thin to accommodate probes during testing of the boards. In the preferred embodiment of the present invention, wherein the circuit board 40 comprises a motherboard that attaches to a computer chassis through grounding hooks, the circuit board must be sufficiently thin to fit within the hook clearance. In the preferred embodiment shown in FIG. 5, the hook clearance is 0.080" (80 mils), so that the maximum board thickness x (with solder deposited on the grounding pads) must be less than 0.080". The bare printed wire board (PWB) 40, before solder is deposited, preferably is designed with a thickness y of 0.062" (62 mils), with a tolerance of 0.007" (7 mils). Consequently, the bare board has a thickness of from 0.055–0.069" (55–69 mils), prior to the soldering phase of assembly.

In a worst case scenario, where the printed circuit board 40 is 0.069" (69 mils) thick, the solder pads on both the top and bottom of the circuit board cannot be higher than a total of 0.011" (11 mils) in order to fit within the hook clearance of 0.080" (80 mils). The solder on the top of the board can be deposited with a fair amount of precision in the situation of surface mounted components, with a deposit height of approximately 0.007–0.008" (7–8 mils), and a reflow height (after the solder is melted) of approximately 0.003–0.004" (3–4 mils). Consequently, the solder deposited on the bottom of the circuit board preferably is less than approximately 0.010" (10 mils) to permit the board to fit within the hook clearance.

At the same time, for proper EMI protection, and to insure a good contact between the grounding hook and grounding screws and the circuit board, it is preferred that the solder height is at least 0.005" (5 mils) on the bottom of the board after wave soldering. Thus, in the preferred embodiment, the solder joints on the bottom of the board have a uniform height of between 0.005–0.010" (5–10 mils) to fit within the hook clearance and still provide adequate EMI protection.

The particular configuration of the pad surfaces 42, 44 (as per FIGS. 1, 2, 3 and 4) for the mounting screw hole aperture 15 will now be discussed in detail in accordance with the preferred embodiment, to achieve the desired solder joint height. In the prior art, typically the hole aperture was constructed as a plated through hole, with a large circular conductive pad surface on both the top side of the board and the bottom side of the board. As noted in the Background section of this application, this prior art technique resulted in a large and uneven amount of solder accumulating on the bottom side of the board during the wave soldering process.

Figure 3:
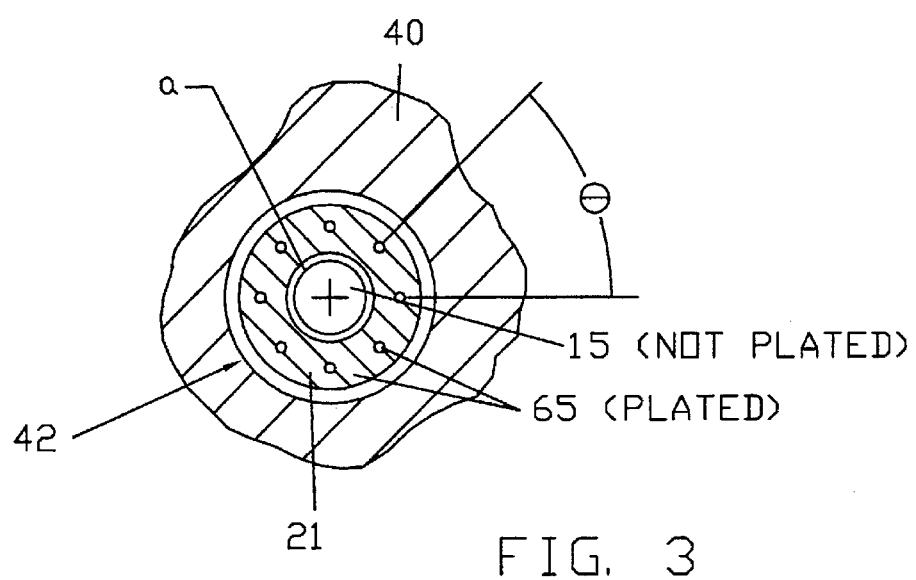
FIG. 3 is an enlarged top view of the mounting screw aperture of FIG. 1.
Figure 4:
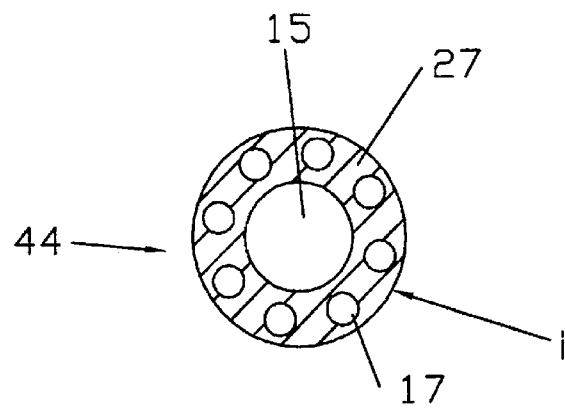
FIG. 4 is an enlarged bottom view of the mounting screw aperture of FIG. 2.

As shown in FIGS. 3, 4 and 8, the screw aperture 15 in the preferred embodiment is not plated as was done previously in the prior art construction. Instead, a plurality of smaller diameter "via" holes 65 are provided in the preferred embodiment spaced equidistantly in a circular arrangement around the screw aperture 15. In the preferred embodiment, eight via holes 65 are provided. The via holes 65 preferably are plated to provide a grounding path for each of the board layers that comprise the circuit board 40. As shown in FIG. 3, the screw apertures 15 have a diameter α, which in the preferred embodiment is 0.166" (166 mils). A circular conductive pad 21 encircles aperture 15. The via holes 65 are positioned radially about aperture 15, spaced apart at an angle θ. In the preferred embodiment (where eight via holes are provided), θ equals 45p. The via holes are constructed with a diameter f. According to the preferred embodiment of the present invention, solder paste is deposited uniformly over the conductive pad surface 21 by an automatic placement machine.

The bottom side of the circuit board (shown in FIG. 4) preferably includes a solder mask layer 27 to control the portions of the circuit board that receive solder during the wave solder process. In accordance with the preferred embodiment, the solder mask layer 27 is configured with small diameter holes 17 that are designed to align with the via holes to permit solder to form in the via holes during the wave solder process and to wet the external pads. As solder forms in the via holes, small dimples preferably are provided on the solder-side of the board at the via hole locations. The dimples extend from the solder-side surface of the circuit board approximately 0.005–0.010" (5–10 mils) in accordance with the preferred embodiment. In the preferred embodiment, the via holes are designed with a diameter f of 0.035" (35 mils) and the solder mask includes holes 17 positioned over the via holes 65 with a diameter i of 0.060" (60 mils). As one skilled in the art will understand, other dimensions can be used without departing from the principles of the present invention. For example, it has been found that the via holes 65 may vary in size from 0.015–0.040" (15–40 mils), while the holes 17 in the bottom solder mask layer 27 may vary from 0.020–0.080" (20–80 mils).

Figure 11:
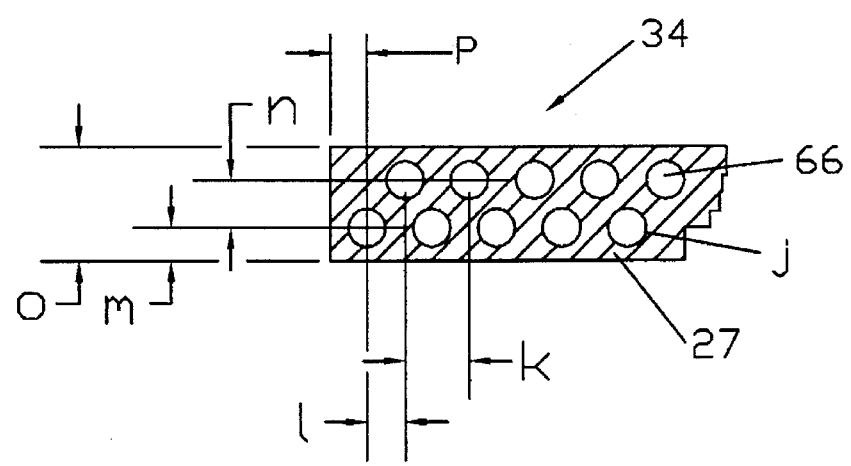
FIG. 11 is an enlarged bottom view of the hook aperture of FIG. 2.

Referring now to FIGS. 6, 7, 10 and 11, the solder pads 34, 47 associated with the elongated hook apertures 45 will now be described. As best seen in FIG. 11, the bottom side of the circuit board 40 includes a conductive pad 34 adjacent the hook aperture 45 for providing an electrical connection to the bottom portion of the grounding hook 46 (FIGS. 6 and 7), or alternatively to the chassis 38. According to the preferred embodiment, and as shown in FIG. 11, the conductive pad 34 is configured as a plurality of small polka dot solder mask openings over conductive areas 66. The polka dot conductive areas 66 preferably are obtained through the use of the solder mask layer 27, which forms the bottom layer of the PC board 40. The solder mask layer 27 includes holes or openings for exposing the underlying conductive surface (which preferably is copper) in the desired pattern.

In the preferred embodiment, the polka dot areas are offset, but they also can arranged uniformly in columns and rows. The diameter of each polka dot area is defined as j with a pad area width of o. In the preferred embodiment, the diameter j is 0.060" (or 60 mils), while the pad width o is 0.145" (145 mils). In the preferred embodiment, the center of the polka dots in adjacent rows are offset a distance l, which preferably is 0.040" (40 mils). The center-to-center distance between adjacent dots in a row is shown as k, which in the preferred embodiment is 0.080" (80 mils). The distance between the centerlines of each row is defined by the variable n, which in the preferred embodiment is a distance of 0.069" (69 mils). The center of each dot preferably is displaced a distance m and p from the edge of pad 34, which in the preferred embodiment is a distance of 0.040" (40 mils).

While a polka dot pattern has been described as the preferred embodiment, other patterns could also be used upon the condition that they provide a relatively uniform solder arrangement, without any bridging between adjacent conductive pad areas, and provided they produce a solder height of between 0.005–0.010" (5–10 mils). Similarly, the size and location of the conductive areas 66 can be modified as necessary to achieve the desired solder height.

Figure 10:
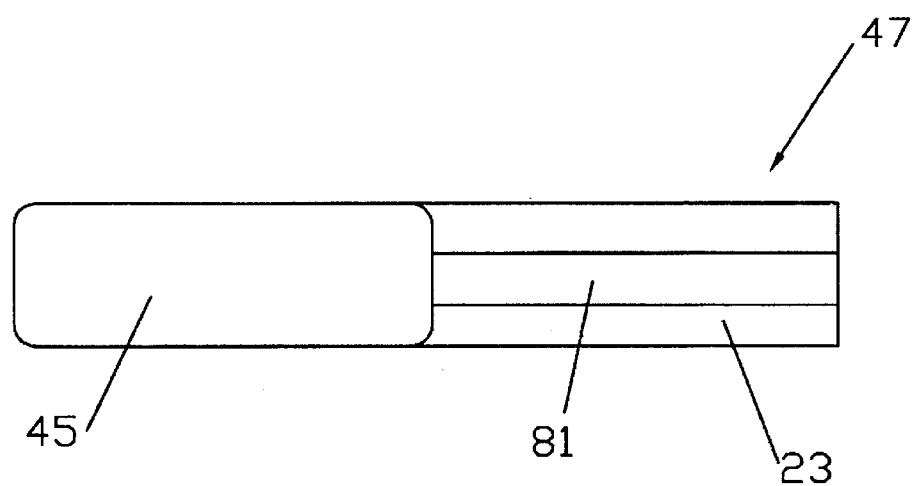
FIG. 10 is an enlarged top view of the hook aperture of FIG. 1.

While a similar polka dot pattern can be used on the surface mount side of the PC board, the preferred embodiment is to use a single strip of conductive material as the conductive pad on the top side of the board. Referring now to FIG. 10, the preferred conductive pad structure 47 for the hook aperture 45 is a single strip of exposed conductive material 81 which has a width that preferably is approximately one third the width of the available pad area. According to the preferred embodiment, this opening in the mask is centered in the pad area to mate with the wiping area of the associated chassis component. The strip preferably is obtained by a solder mask layer 23, which comprises the top layer of the PC board 40. The solder mask layer 23 includes an opening that exposes the narrow conductive strip 81 of the conductive pad 47. In the preferred embodiment, solder paste is deposited on the narrow conductive strip 81 and other openings in the solder mask by a solder paste screening machine, and then the solder paste is reflowed by conventional techniques during the surface mount soldering process. The solder mask functions to contain the solder within the desired pattern to prevent overflow over the entire pad area, while insuring a good quality solder joint at a repeatable height.

Figure 9:
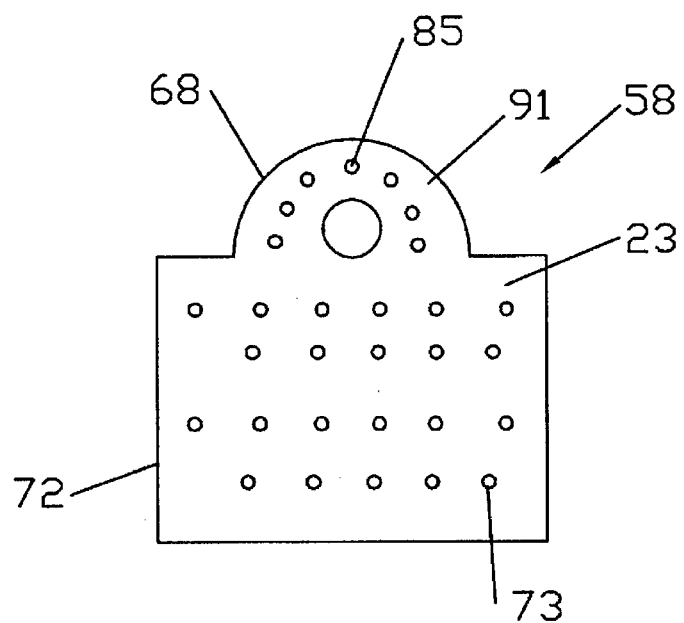
FIG. 9 is an enlarged top view of another conductive pad arrangement, as shown in FIG. 1.

Referring now to FIG. 9, other conductive ground pad surfaces also may be required on the surface mount side of the PC board. FIG. 9 illustrates one possible pad configuration 58 that may be required on the surface side of the board, as shown in FIG. 1. This pad configuration comprises a circular portion 68 and a rectangular portion 72. In the preferred embodiment, the circular portion 68 is constructed with via holes 85 in the board, and with holes in the bottom solder mask layer 27 aligned with the via holes, substantially in accordance with the design of the screw aperture 15 as described in relation to FIGS. 3 and 4. In accordance with the preferred embodiment, the rectangular portion 72 includes top solder mask layer 23 configured with a plurality of offset (or alternatively, uniformly arranged) polka dot openings to expose conductive areas 73 for soldering. Solder preferably is deposited with a uniform height on the conductive areas 73 in the rectangular portion 72 and on the grounding pad 91 comprising the circular portion 68 of pad 58 to insure a high quality electrical contact raised a predetermined distance above the pad.

Constructing the PC board with the solder mask patterns described above produces a high quality electrical contact with the grounding screw and/or hook, while insuring that the solder deposits will be relatively uniform in height to facilitate installation and minimize rework after the wave soldering is complete. As one skilled in the art will understand, the exposed conductive area of other pad configurations can be limited using the various techniques described above.

In the foregoing specification, the invention has been described with reference to the presently preferred embodiment thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

What is claimed is:

1. A printed wire assembly for a personal computer, wherein said printed wire assembly connects to the chassis of said computer by a mounting screw or mounting hook, said printed wire assembly including both surface mounted components and through hole mounted components, said printed wire assembly comprising:

a first solder mask layer as the bottom layer of the printed wire assembly;

a first conductive layer coupled to said first solder mask layer;

an insulating layer coupled to said first conductive pad;

a second conductive layer coupled to said insulating layer;

a second solder mask coupled to said second conductive layer;

an elongated aperture through said printed wire assembly for receiving a mounting hook;

wherein said first solder mask includes a plurality of relatively small circular openings adjacent said aperture for exposing said first conductive pad, said small circular openings having a diameter of approximately 0.060"; and wherein said second solder mask includes a relatively narrow opening strip adjacent said elongated aperture for exposing said second conductive layer.

2. A printed wire assembly as in claim 1, further comprising a plurality of plated via holes positioned around said aperture and corresponding to said circular openings.

3. Printed wire assembly as in claim 1, further comprising a circular aperture for receiving a mounting screw, and wherein said second solder mask includes a plurality of relatively small circular openings disposed around said circular aperture for exposing said second conductive layer.

4. A printed wire assembly as in claim 1, wherein said relatively narrow opening strip has a width opening as wide as said second aperture.

5. A printed circuit board assembly which is installed through the use of a grounding fastener, comprising:

an elongated aperture in the board for receiving the grounding fastener;

a first conductive pad for connecting electrically to the grounding fastener;

a plurality of via holes extending through the circuit board;

a first solder mask provided as one layer of the circuit board, wherein the solder mask includes a plurality of small circular openings having a diameter of approximately 0.060" for exposing the underlying first conductive pad and wherein the first solder mask is positioned at the bottom layer of the printed circuit board, and wherein the plurality of small circular openings in the solder mask are aligned with the via holes;

a second solder mask positioned as the top layer of the printed circuit board; and a second conductive pad for electrically connecting to said grounding fastener;

wherein said first conductive pad connects to a bottom portion of said hook, and said second conductive pad connects to a top portion of said hook; and wherein said second solder mask includes an opening for exposing a narrow strip of said second conductive pad.

6. A printed circuit board assembly as in claim 5 further comprising a circular aperture for receiving a ground screw.

7. A printed circuit board assembly as in claim 6, wherein said via holes are positioned uniformly around the circular aperture.

8. A printed circuit board assembly as in claim 7, wherein solder is applied to the bottom of the circuit board to produce a solder fillet in the via holes.

9. A printed circuit board assembly as in claim 8, wherein the solder fillet extends from said bottom side of said printed circuit board a distance of 0.005–0.010".

10. A printed circuit board assembly as in claim 9, wherein the via hole has a diameter of 0.015–0.050".

11. A printed circuit board assembly as in claim 10, wherein the via hole has a diameter of 0.028–0.040".

12. A printed circuit board assembly as in claim 5, wherein solder is applied to the bottom of the circuit board to produce a solder joint in the circular opening in said solder mask.

13. A printed circuit board assembly as in claim 12, wherein the solder joint is raised to a maximum height of 0.010".

14. A PC board on which surface mounted components are placed; said PC board comprising:

relatively large conductive pad areas on said PC board upon which the surface mounted components are located;

a solder mask positioned over said conductive pad areas to minimize the amount of pad area that is exposed;

wherein the pad area is partially circular and partially rectangular; and wherein said solder mask includes a plurality of small circular openings exposing said conductive pad area, the small circular openings having a diameter of approximately of 0.060" and being arranged in a polka dot pattern around said rectangular portion.

15. A PC board as in claim 14, wherein said circular openings are equally spaced in an offset manner.

16. A PC board as in claim 14, wherein said circular openings are arranged uniformly in rows and columns.

17. A PC board as in claim 14, wherein said circular openings are arranged generally in a circular configuration.

18. A PC board as in claim 14, wherein solder is applied to said circular openings to provide an electrical connection to said conductive pad area.

19. A PC board, as in claim 18, wherein said circular openings are spaced a sufficient distance apart to prevent solder from bridging between openings.

* * * * *